United States Patent
Morgan

(10) Patent No.: US 9,412,433 B2
(45) Date of Patent: Aug. 9, 2016

(54) COUNTER BASED DESIGN FOR TEMPERATURE CONTROLLED REFRESH

(71) Applicant: NANYA TECHNOLOGY CORP., Tao-Yuan Hsien (TW)

(72) Inventor: Donald Martin Morgan, Meridian, ID (US)

(73) Assignee: NANYA TECHNOLOGY CORP., Taoyuan (TW)

(*) Notice: Subject to any disclaimer, the term of this patent is extended or adjusted under 35 U.S.C. 154(b) by 0 days.

(21) Appl. No.: 14/161,655

(22) Filed: Jan. 22, 2014

(65) Prior Publication Data

US 2015/0206575 A1    Jul. 23, 2015

(51) Int. Cl.
G11C 11/406    (2006.01)

(52) U.S. Cl.
CPC .... *G11C 11/40626* (2013.01); *G11C 11/40611* (2013.01)

(58) Field of Classification Search
CPC ............. G11C 11/40626; G11C 11/40611
USPC ..................... 365/149, 233.13, 222
See application file for complete search history.

(56) References Cited

U.S. PATENT DOCUMENTS

| | | | | |
|---|---|---|---|---|
| 5,715,193 A * | 2/1998 | Norman | ............ | G06F 11/1068 365/185.02 |
| 6,233,193 B1 * | 5/2001 | Holland | ............ | G11C 11/406 365/149 |
| 6,272,588 B1 * | 8/2001 | Johnston | ............ | G11C 29/028 365/201 |
| 8,559,258 B1 * | 10/2013 | Stephens, Jr. | .... | G11C 11/40615 365/211 |
| 2004/0179416 A1 * | 9/2004 | Ikeda | ............ | G11C 11/40622 365/222 |
| 2005/0001596 A1 * | 1/2005 | Lovett | ............ | G01K 1/02 320/150 |
| 2006/0044910 A1 * | 3/2006 | Chang | ............ | G11C 11/406 365/222 |
| 2006/0146630 A1 * | 7/2006 | Sohn | ............ | G11C 11/406 365/222 |
| 2009/0154276 A1 * | 6/2009 | Yang | ............ | G11C 11/40611 365/222 |
| 2010/0182862 A1 * | 7/2010 | Teramoto | ............ | G11C 7/04 365/222 |
| 2011/0055671 A1 * | 3/2011 | Kim | ............ | G06F 11/1028 714/800 |
| 2015/0016203 A1 * | 1/2015 | Sriramagiri | ...... | G11C 11/40618 365/222 |

* cited by examiner

*Primary Examiner* — Vu Le
*Assistant Examiner* — Sung Cho
(74) *Attorney, Agent, or Firm* — Winston Hsu; Scott Margo

(57) ABSTRACT

A DRAM includes: a temperature sensor for monitoring a temperature operating condition of the DRAM; and a binary counter coupled to the temperature sensor, for receiving external commands to perform a refresh operation, and incrementing a count upon each received external command, wherein the refresh operation will be selectively skipped according to a value of the binary counter. The binary counter is activated to a first mode when the temperature sensor determines the temperature operating condition of the DRAM goes below a first threshold and activated to a second mode when the temperature sensor determines the temperature operating condition of the DRAM goes below a second threshold lower than the first threshold.

15 Claims, 2 Drawing Sheets

| | 000 | 001 | 010 | 011 | 100 | refresh count | refresh count | External command every 7.8 $\mu$s | External command every 3.9 $\mu$s |
|---|---|---|---|---|---|---|---|---|---|
| 1/4 | ref | skip | skip | skip | reset | 000 | 100 | 31.2 $\mu$s | 15.6 $\mu$s |
| 1/3 | ref | skip | skip | reset | | 000 | ×11 | 23.4 $\mu$s | 11.7 $\mu$s |
| 1/2 | ref | skip | reset | | | 000 | ×10 | 15.6 $\mu$s | 7.8 $\mu$s |
| 2/3 | ref | skip | ref | reset | | 0×0 | ×11 | 11.7 $\mu$s | 5.9 $\mu$s |
| 3/4 | ref | skip | ref | ref | reset | !×01 | 100 | 10.4 $\mu$s | 5.2 $\mu$s |

|     | 000 | 001  | 010   | 011   | 100   | refresh count | refresh count | External command every 7.8 μs | External command every 3.9 μs |
|-----|-----|------|-------|-------|-------|---------------|---------------|-------------------------------|-------------------------------|
| 1/4 | ref | skip | skip  | skip  | reset | 000           | 100           | 31.2 μs                       | 15.6 μs                       |
| 1/3 | ref | skip | skip  | reset |       | 000           | ×11           | 23.4 μs                       | 11.7 μs                       |
| 1/2 | ref | skip | reset |       |       | 000           | ×10           | 15.6 μs                       | 7.8 μs                        |
| 2/3 | ref | skip | ref   | ref   |       | 0×0           | ×11           | 11.7 μs                       | 5.9 μs                        |
| 3/4 | ref | skip | ref   | ref   | reset | !×01          | 100           | 10.4 μs                       | 5.2 μs                        |

COUNTER BASED DESIGN FOR TEMPERATURE CONTROLLED REFRESH

BACKGROUND OF THE INVENTION

1. Field of the Invention

This method relates to a temperature controlled refresh feature such as the feature specified for DDR4 memories, and more particularly, to a temperature controlled refresh feature which uses a counter in order to track external refresh commands, and selectively carry out or skip an internal refresh according to the counter value.

2. Description of the Prior Art

DDR4 is the next generation of DRAM memories, promising faster operating speeds than DDR3, as well as greater power saving and reduction features. The standard operating voltage has been reduced from 1.5V for DDR3 to 1.2V for DDR4, which makes DDR4 suitable for many mobile and handheld devices that require greater power efficiency.

Another feature of DDR4 which promises power reduction is Temperature Controlled Refresh. External refresh commands are usually set so that the DRAM is refreshed every 7.8 micro-seconds, but the length of time for which data can be retained by a DRAM is greater at lower operating temperatures. By monitoring the operating temperature of the DDR4 with a built-in temperature sensor, external refresh commands can be skipped when the DDR4 is at lower temperatures, and this feature can then be de-activated as the temperature rises to normal operating conditions. This can give up to a 20% reduction in power.

The current specification for DDR4 DRAM specifies a normal mode, where external refresh commands are provided every 7.8 micro-seconds, and an extended temperature mode, where external refresh commands are provided every 3.9 micro-seconds. The mode is selected using MRS commands. The DDR4 spec provides three temperature ranges, which are: less than 45° C., 45° C. to less than 85° C., and 85° C. to less than 95° C. If the DRAM is to be operated at 85° C. and above, it must be programmed to the extended temperature mode and the DRAM controller must provide refresh commands every 3.9 micro-seconds according to the extended temperature mode of operation. By using the Temperature Controlled Refresh function, certain refresh commands can be skipped to conserve power while still guaranteeing that data will be safely maintained. The Temperature Controlled Refresh function is activated using MRS commands. Once activated, the DRAM will manage this feature automatically for either the normal or extended temperature mode. In certain modes and in a certain temperature range, half of the external refresh commands may be skipped. In other conditions, different ratios of external commands to internal refresh could be provided making further power savings achievable.

SUMMARY OF THE INVENTION

The present invention therefore aims to provide a programmable auto refresh function, which can provide different programmable ratios of external command to internal refresh, to thereby achieve greater granularity.

A DRAM comprises: a binary counter, coupled to the internal refresh mechanism, for receiving external refresh commands and incrementing a count upon each received external refresh command, wherein the internal refresh mechanism will be selectively skipped according to certain states of the binary counter.

A method for selectively performing a refresh operation of a DRAM comprises: providing a binary counter; receiving external commands to perform a refresh operation; incrementing a count of the binary counter upon each received external command; and selectively skipping a refresh operation according to a value of the binary counter.

These and other objectives of the present invention will no doubt become obvious to those of ordinary skill in the art after reading the following detailed description of the preferred embodiment that is illustrated in the various figures and drawings.

DETAILED DESCRIPTION

The present invention aims to provide a counter based design for the Temperature Controlled Refresh feature, which can provide even greater granularity than at present. Modifications to the size of the counter and to the number of states therein can offer a wide range of programmable refresh options.

The most basic embodiment of the present invention proposes a 2-bit counter, which increments upon each external refresh command. A comparison of the most significant bit (MSB) to the least significant bit (LSB) can lead to a number of 'refresh, skip, reset' options. Please refer to FIG. 1, which illustrates two possible uses of the 2-bit counter for achieving a number of different refresh modes. The 2-bit counter will have four possible states, as shown below:

State 1: 0, 0
State 2: 0, 1
State 3: 1, 0
State 4: 1, 1

Figure 1:
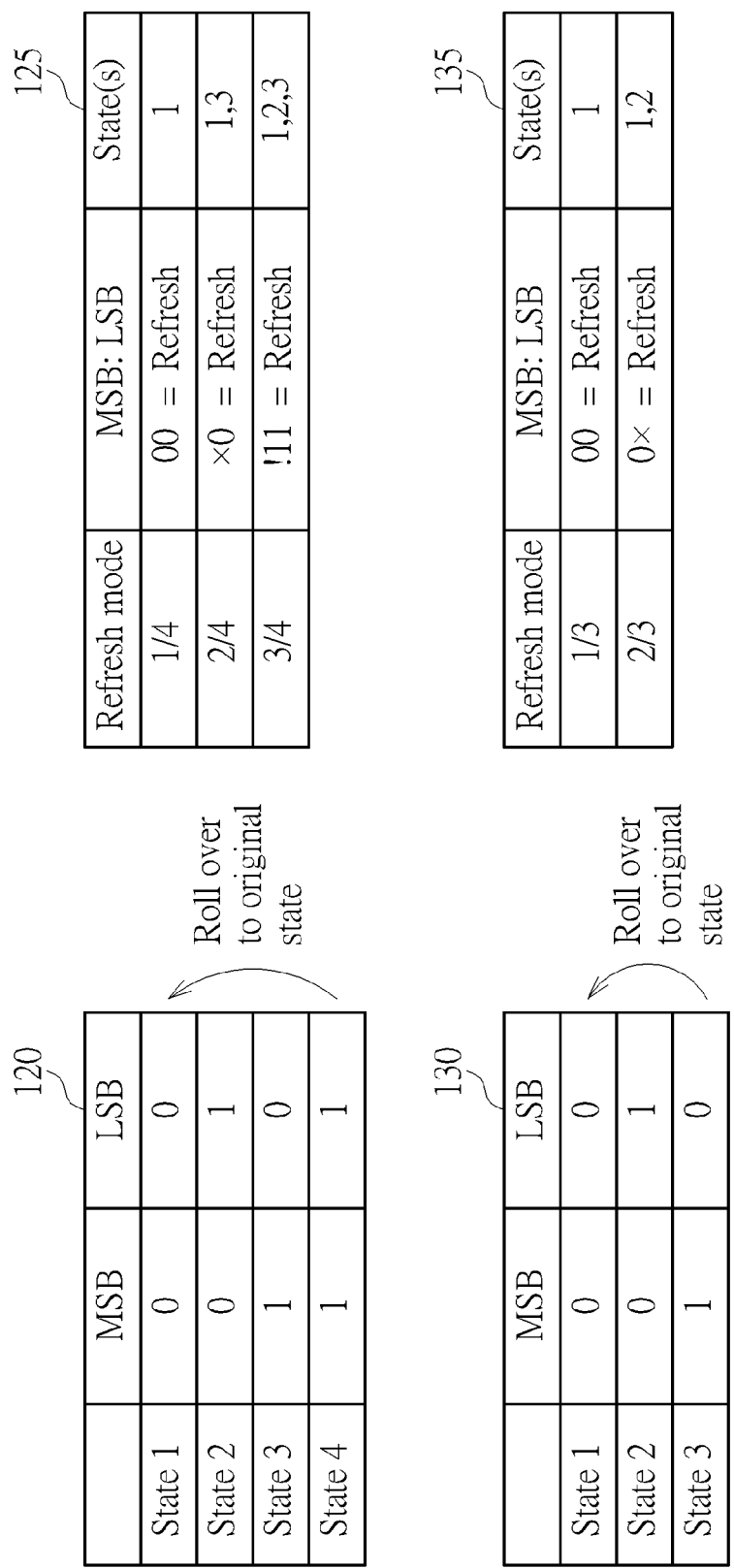
FIG. 1 is a diagram illustrating basic operations of a 2-bit counter according to an exemplary embodiment of the present invention.

Table 120 in FIG. 1 illustrates the incrementing of the counter and the corresponding four states. In State 4, the counter will always roll over back to State 1, which is equivalent to resetting the counter. The other three states can correspond to an internal refresh or skipping of the refresh, by comparing the MSB and the LSB. The 2-bit counter can therefore provide three refresh modes, as illustrated in table 125. A first refresh mode has one refresh for every four external commands (1/4), wherein the refresh will only occur when both the MSB and LSB are equal to zero (i.e. State 1). A second refresh mode has two refreshes for every four external commands (2/4), wherein the refresh will only occur when the LSB is equal to zero (i.e. States 1 and 3). A third refresh mode has three refreshes for every four external commands (3/4), wherein the refresh occurs with every external command, apart from when the MSB and LSB are both equal to one (i.e. States 1, 2 and 3).

An early reset can also be added to the 2-bit counter, which further adds versatility. This is illustrated in table 130 of FIG. 1, which shows the three states of the 2-bit counter with early reset. State 3 is now the reset state, where the counter will roll over back to State 1. This early reset therefore provides two further refresh modes, respectively having a 1/3 and 2/3 refresh ratio, as illustrated in table 135.

Using a 3-bit counter, which has eight possible states, provides a greater range of refresh modes having possible respective 1/8, 2/8, 3/8, 4/8, 5/8, 6/8 and 7/8 refresh ratios. The option of early reset for the 3-bit counter further increases the possible refresh ratios. Moreover, if the early reset is when both LSBs are ONES (i.e. State 4) then the 3-bit counter can operate as the 2-bit counter detailed above.

Figure 2:
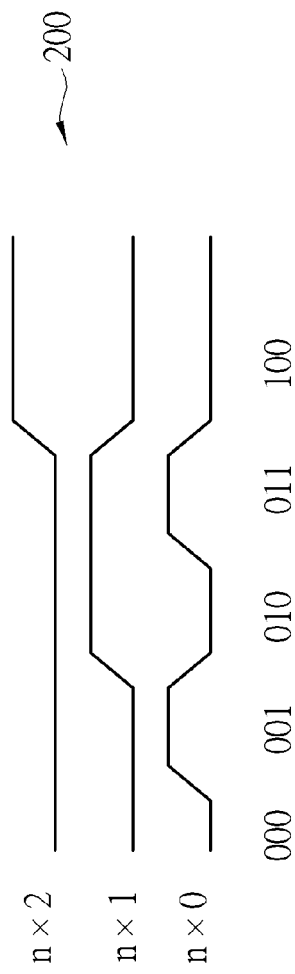
FIG. 2 is a diagram illustrating operating states of a 3-bit counter according to an exemplary embodiment of the present invention.

The 3-bit counter can be supplemented by a circuit, which monitors the states on three data lines to reach a 3-bit binary number, which is then used as the basis for performing a reset, refresh or skip operation. Please refer to FIG. 2, which illustrates the three data lines nx0, nx1, nx2 of the circuit 200. FIG. 2 further illustrates a table 250, which details five refresh modes of the circuit 200, as well as the refresh rates provided therein, according to both a normal and extended temperature mode. As detailed in the above, all refresh modes are made possible by providing an early reset which gives greater flexibility.

The table 250 illustrates states <000, 001, 010, 011, 100>, and five different refresh modes having internal refresh to external command ratios 1/4, 1/3, 1/2, 2/3, 3/4. Extended temperature mode external commands are every 3.9 micro-seconds and normal temperature mode external commands are every 7.8 micro-seconds. The fine granularity achieved by the different refresh modes allows for a large range of refresh rates, which can be used to provide greater flexibility when a DDR4 DRAM is operating at low temperatures.

To summarize, by providing a counter-based refresh system which can be programmed to correspond to a number of different refresh modes, greater granularity of the Temperature Controlled Refresh function can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM, comprising:
  a binary counter, for receiving external commands at a steady rate, and selectively outputting an internal refresh command in response to each received external command to perform a refresh operation, wherein a binary value of the binary counter will be incremented upon each received external command, and the internal refresh command will be selectively output according to at least one of a most significant bit and a least significant bit of the binary counter so that the refresh operation will be selectively skipped according to a value of the binary counter.

2. The DRAM of claim 1, further comprising:
  a temperature sensor coupled to the binary counter, for monitoring a temperature operating condition of the DRAM.

3. The DRAM of claim 2, wherein the binary counter is activated to a first mode when the temperature sensor determines the temperature operating condition of the DDR4 DRAM goes below a first threshold, and is activated to a second mode when the temperature sensor determines the temperature operating condition of the DDR4 DRAM goes below a second threshold lower than the first threshold, wherein the mode is for setting the rate of the external commands.

4. The DRAM of claim 1, wherein the binary counter rolls over to an original value when the binary counter is incremented to a maximum value.

5. The DRAM of claim 1, wherein the binary counter is programmed to be reset when the binary counter is incremented to a specific value less than the maximum value.

6. The DRAM of claim 1, wherein the binary counter is a 2-bit binary counter.

7. The DRAM of claim 1, wherein the binary counter is a 3-bit binary counter.

8. The DRAM of claim 1, being a DDR4 DRAM.

9. A method for selectively performing a refresh operation of a DRAM, comprising:
  providing a binary counter;
  receiving external commands at a steady rate and incrementing a binary value of the binary counter upon each received external command; and
  selectively outputting an internal refresh command in response to each received external command to perform a refresh operation;
  wherein the internal refresh command is selectively output according to at least one of a most significant bit and a least significant bit of the binary counter so that the refresh operation will be selectively skipped according to a value of the binary counter.

10. The method of claim 9, wherein the step of incrementing a count of the binary counter comprises:
  monitoring a temperature operating condition of the DRAM; and
  activating the binary counter when the temperature operating condition of the DRAM goes below a first threshold.

11. The method of claim 10, wherein the binary counter is activated to a first mode when the temperature operating condition of the DRAM goes below a first threshold, and is activated to a second mode when the temperature operating condition of the DRAM goes below a second threshold lower than a first threshold, wherein the mode is for setting the rate of the external commands.

12. The method of claim 9, further comprising:
  when the binary counter is incremented to a maximum value, rolling the count back to an original state.

13. The method of claim 9, further comprising:
  when the binary counter is incremented to a specific value less than the maximum value, resetting the binary counter.

14. The method of claim 9, wherein the binary counter is a 2-bit binary counter.

15. The method of claim 9, wherein the binary counter is a 3-bit binary counter.

* * * * *